(12) United States Patent
Banaska et al.

(10) Patent No.: US 9,651,585 B2
(45) Date of Patent: May 16, 2017

(54) VIA LAYOUT TECHNIQUES FOR IMPROVED LOW CURRENT MEASUREMENTS

(71) Applicant: NATIONAL INSTRUMENTS CORPORATION, Austin, TX (US)

(72) Inventors: John G. Banaska, Cedar Park, TX (US); Pablo Limon, Cedar Park, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 368 days.

(21) Appl. No.: 14/133,167

(22) Filed: Dec. 18, 2013

(65) Prior Publication Data

US 2015/0168463 A1   Jun. 18, 2015

(51) Int. Cl.
   *H05K 3/30* (2006.01)
   *G01R 31/28* (2006.01)
   *G01R 19/00* (2006.01)
   *H05K 1/02* (2006.01)
   *G01R 3/00* (2006.01)

(52) U.S. Cl.
   CPC .......... *G01R 19/0092* (2013.01); *G01R 3/00* (2013.01); *H05K 1/0219* (2013.01); *H05K 1/0268* (2013.01); *H05K 2201/09618* (2013.01); *Y10T 29/49147* (2015.01)

(58) Field of Classification Search
   CPC ............... H05K 3/30; H05K 1/0221; H05K 2201/09618; H05K 1/0222; G01R 31/28
   USPC .......... 174/36, 260, 262; 324/76.11; 29/842
   See application file for complete search history.

(56) References Cited

U.S. PATENT DOCUMENTS

| | | | | |
|---|---|---|---|---|
| 3,093,805 A | * | 6/1963 | Osifchin | H01P 3/006 174/117 R |
| 3,777,221 A | * | 12/1973 | Tatusko | H01L 23/5384 174/261 |
| 4,912,603 A | * | 3/1990 | Seyama | H01L 23/5384 174/261 |
| 5,262,783 A | * | 11/1993 | Philpott | G01S 7/032 342/114 |
| 5,475,606 A | * | 12/1995 | Muyshondt | H05K 1/0218 174/257 |
| 5,742,009 A | | 4/1998 | Hamzehdoost | |
| 5,784,262 A | * | 7/1998 | Sherman | H05K 1/114 174/261 |
| 6,040,524 A | * | 3/2000 | Kobayashi | H05K 1/0219 174/262 |
| 6,047,467 A | | 4/2000 | Hamzehdoost | |
| 6,614,662 B2 | | 9/2003 | Stickler | |

(Continued)

*Primary Examiner* — Michael F McAllister
(74) *Attorney, Agent, or Firm* — Meyertons Hood Kivlin Kowert & Goetzel, P.C.; Jeffrey C. Hood; Brian E. Moore

(57) ABSTRACT

System and methods for use and fabrication of a printed circuit board (PCB). The PCB may include a node and a plurality of rows of vias that may be configured to establish a plurality of current pathways away from the node. The node may be a sensitive node and the plurality of current pathways may reduce leakage current at the node responsive to a signal applied to the node. Each row of the plurality of rows of vias may be offset with respect to adjacent rows of vias in a horizontal plane of the PCB. The PCB may have multiple layers and the node may be on an exterior surface layer or an interior layer. The vias may be mirco-vias, buried-vias, or through-vias.

16 Claims, 6 Drawing Sheets

(56) References Cited

U.S. PATENT DOCUMENTS

| | | | |
|---|---|---|---|
| 6,756,936 B1* | 6/2004 | Wu | G01S 7/032 |
| | | | 342/175 |
| 6,864,670 B2 | 3/2005 | Ouyang | |
| 6,876,836 B2 | 4/2005 | Lin | |
| 7,205,668 B2 | 4/2007 | Wu | |
| 7,545,233 B2 | 6/2009 | Lin | |
| 7,615,706 B2 | 11/2009 | Chen | |
| 7,639,173 B1* | 12/2009 | Wang | G01S 7/032 |
| | | | 342/114 |
| 7,838,778 B1 | 11/2010 | Hasko | |
| 7,880,094 B2 | 2/2011 | Chi | |
| 8,115,568 B2 | 2/2012 | Hsu | |
| 8,117,586 B2 | 2/2012 | Sheng | |
| 8,201,135 B2 | 6/2012 | Sheng | |
| 8,245,181 B2 | 8/2012 | Sheng | |
| 8,255,863 B2 | 8/2012 | Sheng | |
| 8,256,111 B2 | 9/2012 | Lin | |
| 8,291,370 B2 | 10/2012 | Wu | |
| 8,336,203 B2 | 12/2012 | Lin | |
| 8,344,821 B2 | 1/2013 | Lin | |
| 8,378,759 B2* | 2/2013 | Margomenos | H01P 3/081 |
| | | | 333/1 |
| 8,418,357 B2 | 4/2013 | Chen | |
| 8,434,050 B2 | 4/2013 | Yen | |
| 8,609,996 B2 | 12/2013 | Lin | |
| 8,826,220 B2 | 9/2014 | Yu | |
| 9,326,369 B2* | 4/2016 | Niemann | H05K 3/306 |
| 2003/0193326 A1* | 10/2003 | Belady | G01R 15/181 |
| | | | 324/127 |
| 2011/0175793 A1* | 7/2011 | Suzuki | H01L 23/552 |
| | | | 343/905 |

\* cited by examiner

VIA LAYOUT TECHNIQUES FOR IMPROVED LOW CURRENT MEASUREMENTS

FIELD OF THE INVENTION

The present invention relates to the field of current measurements on printed circuit boards, and more particularly to a system and methods for improving the accuracy of low current measurements on printed circuit boards.

DESCRIPTION OF THE RELATED ART

There are many factors to consider when attempting to measure low values of current, e.g., pico-amperes and lower, on a printed circuit board (PCB). For example, the PCB itself may be a source of error and affect the accuracy of the measurement through current leakage and dielectric absorption because current leakage and dielectric absorption currents cannot be discriminated from the signal being measured. Thus, it may be desirable to minimize the effect from these error sources.

Techniques such as guarding and material removal are commonly used to raise leakage resistance and minimize charges trapped in the dielectric. Prior art techniques include creating "insulated islands" for the measurement node and making trenches around the measurement node. These techniques effectively remove the material around, and in some instances, underneath, the measurement node and create a gap of air around the measurement node, decreasing leakage currents and dielectric charging currents. In the prior art, these techniques of making trenches in the board and isolating the measurement node with air gaps are seen as the most advantageous solutions for improving low current measurements, however, each require a large amount of the PCB real estate. For example, in a dual sided PCB with multiple layers, using trenches (or slots, or cuts) in the board removes the PCB real state underneath the measurement node and also prevents the routing of signals directly underneath the measurement node. Additionally, the trenching causes the PCB to become fragile because the measurement node is now floating. In other words, the measurement node may only be attached to the main portion of the PCB by small portions of PCB and components (which themselves are fragile). Additionally, for very low level current measurements, e.g., on the range of femto-amperes, this technique does not address other problems that may be present.

Other corresponding issues related to the prior art will become apparent to one skilled in the art after comparing such prior art with the present invention as described herein.

SUMMARY OF THE INVENTION

Various embodiments of a printed circuit board (PCB) to improve low current measurement are presented below. The various embodiments, or portions and combinations thereof, may be used in a method for measuring current at a node as described herein. Further, the various embodiments, or portions and combinations thereof, may be fabricated using a method for fabricating a PCB as described herein.

In an exemplary embodiment, a PCB may include a node and a plurality of rows of vias that may be configured to establish a plurality of current pathways away from the node. The plurality of current pathways may reduce leakage current at the node responsive to a signal applied to the node. In one embodiment, each row of vias of the plurality of rows of vias may be offset with respect to adjacent rows of vias in a horizontal plane of the PCB.

In certain embodiments, PCB may include a plurality of layers and the node and the plurality of rows of vias may be included in a first layer of the plurality of layers. In such embodiments, the first layer may be an exterior surface layer of the PCB. Accordingly, the plurality of rows of vias may include at least one of a plurality of rows of micro-vias or a plurality of rows of through-vias, or both. Further, a second layer of the plurality of layers may include a guard plane. The guard plane may be configured to reduce leakage current at the node. Additionally, the second layer may be vertically adjacent to the first layer.

In other embodiments, the first layer may be an interior layer of the PCB. In such embodiments, the plurality of rows of vias may include at least one of a plurality of rows of buried-vias, or a plurality of rows of through-vias. Additionally, a second layer and a third layer of the plurality of layers of the PCB may each include a guard plane. Each guard plane may be configured to reduce leakage current at the node and the second layer and the third layer may each be vertically adjacent to the first layer.

In some embodiments where the first layer is an interior layer of the PCB, the PCB may further include a cavity and the node may be accessible via the cavity. In some embodiments, the cavity may include a via and the node may be accessible by the via. In one embodiment, a second layer and a third layer may each include a guard plane and each guard plane may be configured to reduce leakage current at the node. Accordingly, the second layer and the third layer may each be vertically adjacent to the first layer of the PCB.

In an exemplary embodiment, the embodiments described above may be used in a method for measuring current at a node. Thus, a signal may be applied to a node and a plurality of current pathways away from the node may be established. The plurality of current pathways may reduce leakage current at the node responsive to the signal applied to the node. Accordingly, the current may be measured at the node.

Further, a method for fabricating a PCB according to the embodiments described herein may include disposing a measurement terminal on the PCB. The method may also include configuring a plurality of rows of vias that may establish a plurality of current pathways away from the measurement terminal. Further, the plurality of current pathways may reduce leakage current at the measurement terminal responsive to a signal applied to the measurement terminal.

In one embodiment, the method may also include offsetting each row of vias of the plurality of rows of vias with respect to adjacent rows of vias in a horizontal plane of the PCB. In another embodiment, the PCB may include a plurality of layers and the method may include disposing the measurement terminal on a first layer of the plurality of layers and configuring the plurality of rows of vias in the first layer. In certain embodiments, the first layer may be one of an exterior surface layer of the PCB or an interior layer of the PCB. Additionally, in some embodiments, the plurality of rows of vias may include at least one of a plurality of rows of micro-vias, a plurality of rows of through-vias or a plurality of rows of buried-vias.

In another embodiment, where the first layer may be an interior layer of the PCB, the method may also include configuring a cavity in the PCB and the measurement terminal may be accessible via the cavity. Additionally, in one embodiment, the cavity may include a via and the terminal may be accessible by the via.

BRIEF DESCRIPTION OF THE DRAWINGS

A better understanding of the present invention can be obtained when the following detailed description of the preferred embodiment is considered in conjunction with the following drawings, in which.

Figure 1:
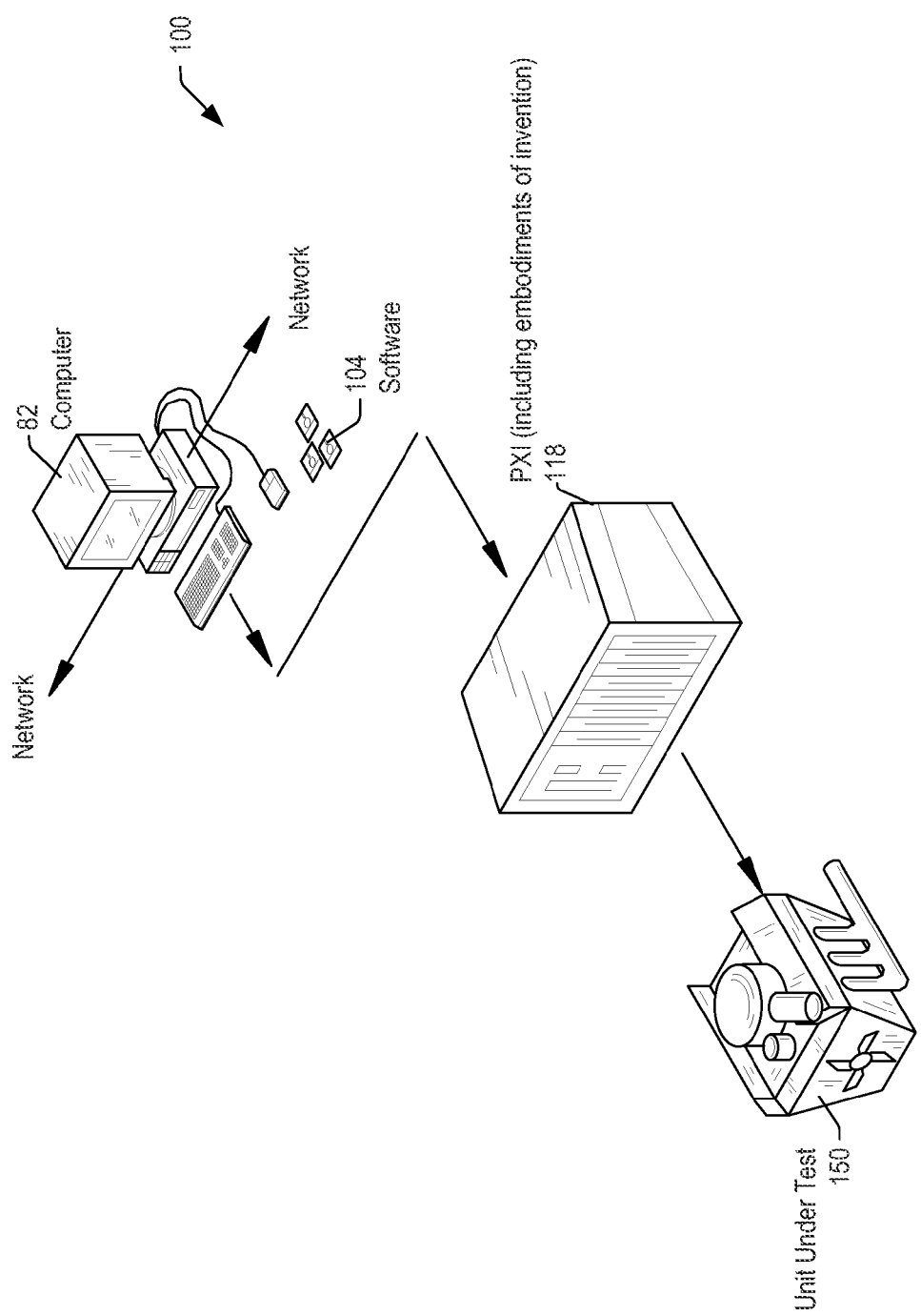
FIG. 1 illustrates a system which may include embodiments of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Terms

The following is a glossary of terms used in the present application:

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism", where the tasks are performed in an interleaved manner, e.g., by time multiplexing of execution threads.

Via—refers to an electrical connection between vertical layers of a printed circuit board (PCB). A via may include a barrel, a pad, and an antipad. The barrel may be a conductive tube filling or partially filling a hole formed by drilling, laser cutting, etc. The pad may connect each end of the barrel to a component, plane, or trace. The antipad may be a clearance hole or cavity between the barrel and an unconnected metal layer.

Micro-via—refers to a via on an exterior surface layer of a layered PCB that does not extend to another exterior surface layer of a layered PCB.

Buried-via—refers to a via connecting interior layers of a layered circuit board. Buried-vias are not exposed at any exterior surface of the PCB. Note, buried-vias may be considered mirco-vias or through-vias that are no longer exposed to an exterior surface of the PCB.

Through-via—refers to vias that extend from one exterior surface to another exterior surface of a layered PCB.

Dielectric Absorption—refers to the charge retained in materials due to the high series resistance of the materials. Dielectrics such as Teflon, polystyrene, and polypropylene are considered to have low dielectric absorption whereas vinyl and polyvinyl chloride (PVC) are considered to have high dielectric absorption. Also referred to as soakage or voltage retention.

Guard—refers to shielding used to prevent stray currents from entering sensitive measurement nodes. In other words, the guard, or guard layer or plane, sinks stray currents, e.g., leakage currents, away from the sensitive measurement node.

FIG. 1—Exemplary Instrumentation System

FIG. 1 illustrates an exemplary instrumentation system 100 configured with embodiments of the present invention. Embodiments of the present invention may be involved with performing test and/or measurement functions; controlling and/or modeling instrumentation or industrial automation hardware; modeling and simulation functions, e.g., modeling or simulating a device or product being developed or tested, etc. However, it is noted that embodiments of the present invention can be used for a plethora of applications and is not limited to the above applications. In other words, applications discussed in the present description are exemplary only, and embodiments of the present invention may be used in any of various types of systems.

As shown in FIG. 1, the system 100 may include a host computer 82. The host computer 82 may be coupled to a network and include a display device and at least one memory medium on which one or more computer programs or software components, may be stored. For example, the memory medium may store one or more graphical programs which are executable to perform the methods described herein. Additionally, the memory medium may store a graphical programming development environment application used to create and/or execute such graphical programs. The memory medium may also store operating system software, as well as other software for operation of the computer system.

Further, the host computer 82 may include a central processing unit (CPU) and one or more input devices such as a mouse or keyboard as shown. The computer 82 may operate with the one or more instruments to analyze, measure or control a unit under test (UUT) 150, e.g., via execution of software 104.

The one or more instruments may include PXI instrument 118. PXI instrument 118 may include a source-measure unit (SMU) which may include embodiments of the present invention. Alternatively, the SMU may be included in another type of chassis or may by a stand-alone, or independent, device which may also include embodiments of the present invention. The computer system may couple to and operate with PXI instrument 118. PXI instrument 118 may be coupled to the UUT 150. The system 100 may be used in a data acquisition and control application or in a test and measurement application, among others. Additionally, PXI instrument 118 may couple to host computer 82 over a network, such as the Internet.

Exemplary Embodiments

Embodiments of the present invention may be involved with performing test functions, performing measurement functions, controlling instrumentation, controlling industrial automation hardware, etc. However, it is noted that embodiments of the present invention can be used for a plethora of applications and is not limited to the above applications. In other words, applications discussed in the present description are exemplary only, and embodiments of the present invention may be used in any of various types of systems.

Figure 2:
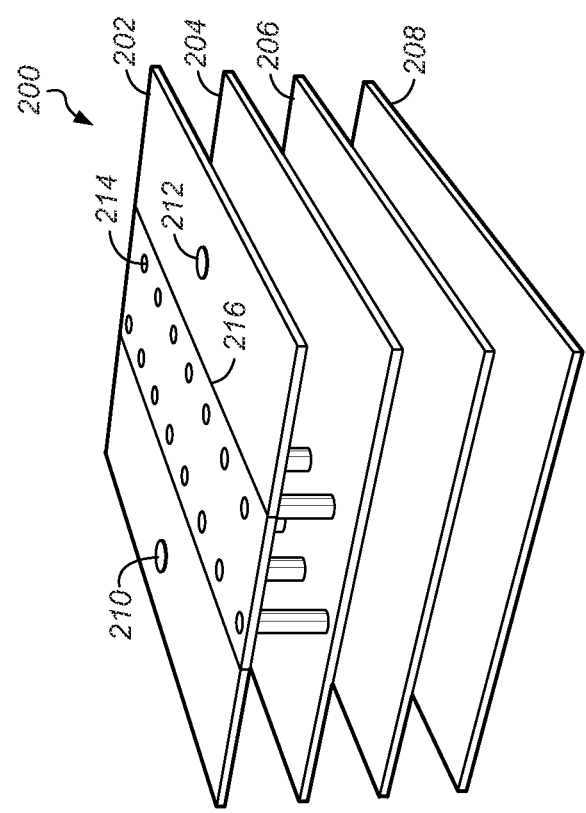
FIG. 2 illustrates layers of a printed circuit board (PCB) with vias according to principles of the present invention.

FIG. 2 illustrates an exemplary printed circuit board (PCB). As illustrated, PCB 200 may include one or more layers, such as layers 202-208. Each layer 202-208 may be bonded or joined to another layer via an epoxy or other filler material, not shown. Further, layers of the PCB may be vertically adjacent to one another. Thus, as shown, layer 204 is vertically adjacent to layer 202. Similarly, layer 208 is vertically adjacent to layer 206 and layer 206 is vertically adjacent to layer 204. As shown, layers 206 and 208 may be circuit, or trace, layers. Notably, layers 206 or 208 may be formed, or made, from copper. As illustrated, layers 202 and 208 may be considered exterior surface layers whereas layers 204 and 206 may be considered interior layers. Additionally, layer 202 may include nodes 210 and 212. Nodes 210 and 212 may be measurement nodes. In one embodiment, node 212 may be the high, or aggressor node, and node 210 may be the low, or sensitive node. Layer 202 may also include guard 216. The term guard, or guard layer or plane, refers to shielding used to prevent stray currents from entering sensitive measurement nodes. In other words, the guard, guard plane, or guard layer, sinks stray currents, e.g., leakage currents, away from the sensitive measurement node. Thus, the guard 216 may sink stray currents away from node 210.

Additionally, layer 202 may include vias 214. The term via, or vias, generally refers to an electrical connection between vertical layers of a printed circuit board (PCB). A via may include a barrel, a pad, and an antipad. The barrel may be a conductive tube filling or partially filling a hole formed by drilling, laser cutting, etc. The pad may connect each end of the barrel to a component, plane, or trace. The antipad may be a clearance hole or cavity between the barrel and an unconnected metal layer. As shown, vias 214 may be electrically coupled to guard 216. Accordingly, vias 214 may be micor-vias. The term micro-via refers to a via on an exterior surface layer of a layered PCB that does not extend to another exterior surface layer of a layered PCB. Additionally, the vias 214 may be configured in multiple, e.g., a plurality of, rows.

Further, the rows may be configured such that a plurality of current pathways may be established. The plurality of current pathways may reduce leakage current at node 210 responsive to a signal applied to node 210. The term current pathways refers to the path a current may take through the material. Thus, the rows may be configured to alter existing current pathways through the material or to establish new current pathways through the material. In either case, the current pathways that may be established reduce leakage current flowing through the PCB layer at the node. In other words, the new or altered current paths dissipate the amount of current that may reach the node by flowing through the material of the PCB layer. Accordingly, the plurality of current pathways may reduce leakage current that may result from dielectric absorption. Dielectric absorption, or soakage/voltage retention, refers to the charge retained in materials due to the high series resistance of the materials. Dielectrics such as Teflon, polystyrene, and polypropylene are considered to have low dielectric absorption whereas vinyl and polyvinyl chloride (PVC) are considered to have high dielectric absorption. In one embodiment, each row of vias may be offset with respect to adjacent rows of vias in a horizontal plane of the PCB, thereby increasing the number of current pathways.

Further, in one embodiment, layer 204 may be a guard layer, or guard plane. Layer 204 may be electrically coupled to guard 216 by vias 214. Thus, in certain embodiments, guard layer 216 may be configured to reduce leakage current at node 210 and may be vertically adjacent to layer 202.

Figure 3:
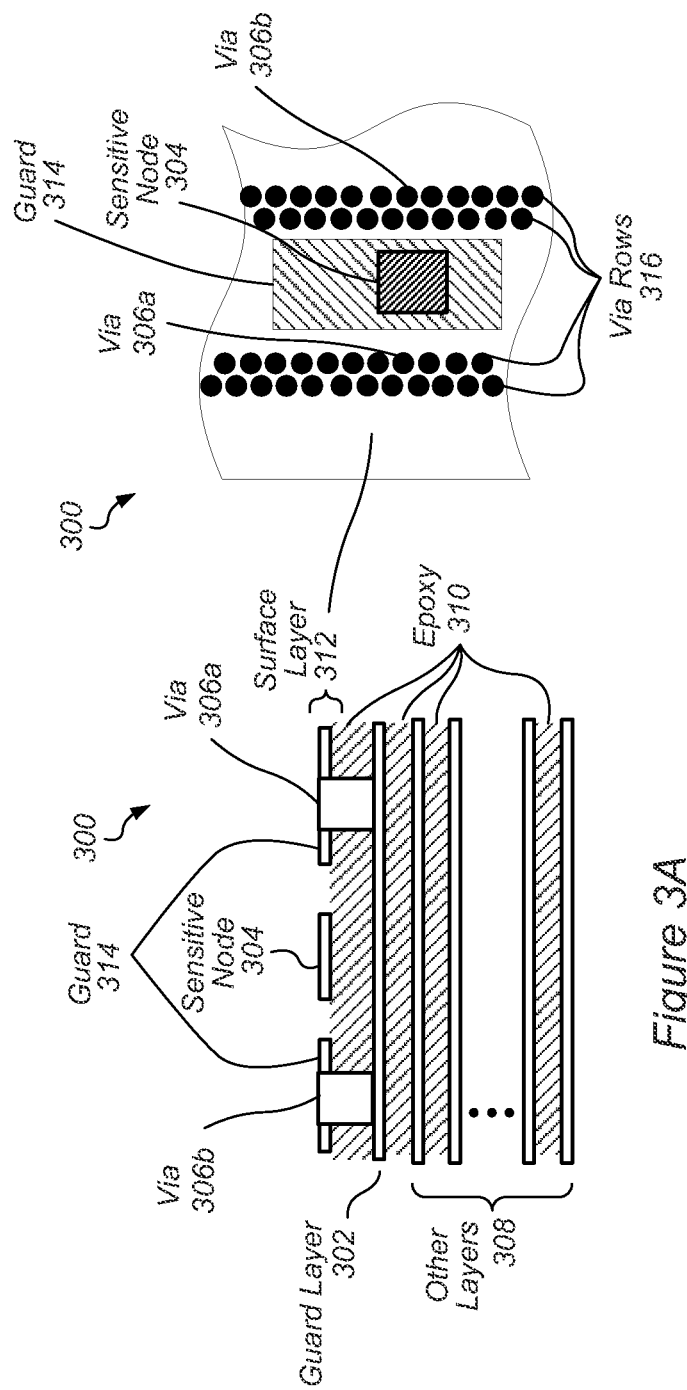
FIG. 3A illustrates a cross-sectional view of layers of a PCB with a surface node and vias according to principles of the present invention FIG. 3B illustrate a top view of a PCB with vias according to principles of the present invention.

FIGS. 3A-B illustrate another embodiment of the present invention. As illustrated, PCB 300 may include multiple layers such as exterior surface layer 312, guard layer 302, and one or more other layers 308. Note, in certain embodiments, PCB 300 may not include other layers 308. Epoxy 310 or another type of filler material may couple the layers of the PCB to one another. In one embodiment, surface layer 312 may include a guard 314, sensitive node 304, and a plurality of vias 306a-b. As illustrated in FIG. 3B, the plurality of vias 306a-b may be configured in a plurality of rows 316. The plurality of rows of vias 316 may be configured to establish a plurality of current pathways away from the sensitive node 304. The plurality of current pathways may reduce leakage current at sensitive node 304 responsive to a signal applied to sensitive node 304. Further, as illustrated, each row of vias of the plurality of rows vias 316 may be offset with respect to adjacent rows of vias in a horizontal plane of the PCB 300. Vias 306a-b may be electrically coupled to guard layer 302. As shown, vias 306a-b may be micro-vias. In other embodiments, vias 306a-b may be through-vias.

Figure 4:
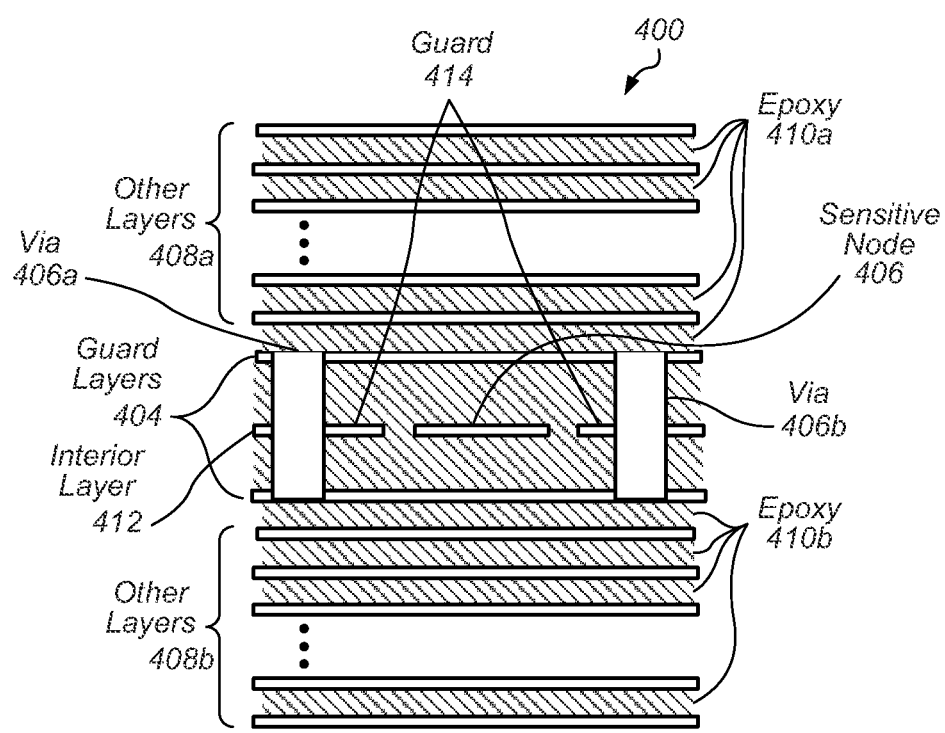
FIG. 4 illustrates a cross-section view of layers of a PCB with an interior node and vias according to principles of the present invention.

FIG. 4 illustrates another embodiment of the present invention. As illustrated, PCB 400 may include multiple layers such as layers 408a-b, guard layers 404, and interior layer 412. The layers may be coupled together by a filler material, such as epoxy 410a-b. Interior layer 412 may include sensitive node 406 and guard 414. Vias 406a-b may electrically couple interior layer 412 to guard layers 404. Additionally, vias 406a-b may be buried-vias. The term buried-via refers to a via connecting interior layers of a layered circuit board. Buried-vias are not exposed at any exterior surface of the PCB. Note, buried-vias may be considered mirco-vias or through-vias that are no longer exposed to an exterior surface of the PCB. Alternatively, in another embodiment, some or all of the vias 406a-b may be through vias.

Further, vias 406a-b may be configured in a plurality of rows. The plurality of rows may be configured to establish a plurality of current pathways away from the measurement node. The plurality of current pathways may reduce leakage current at sensitive node 406 responsive to a signal applied to sensitive node 406. Further, each row of vias of the plurality of rows vias may be offset with respect to adjacent rows of vias in a horizontal plane of the PCB 400.

Although two rows of vias are shown in FIG. 4, it is envisioned that the PCB may be configured with more rows of vias in order to provide additional current pathways for leakage currents that may be due to dielectric absorption. Further, the rows may be curved or arched around the sensitive node. In one embodiment, the plurality of rows of vias may encompass the node. In other words, the plurality of rows may be configured in concentric circles or ellipses.

Figure 5:
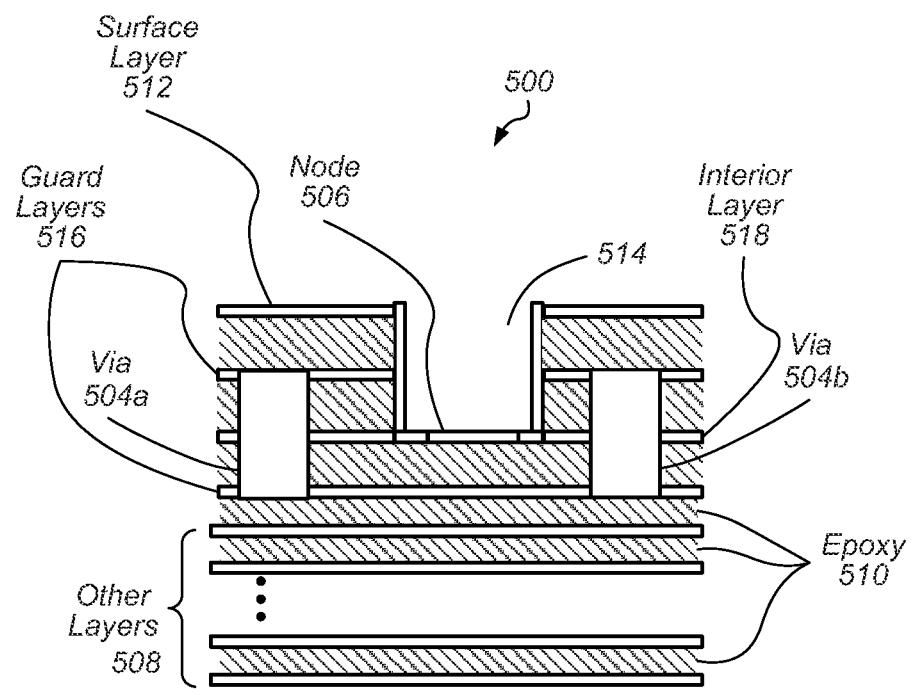
FIG. 5 illustrates a cross-section view of layers of a PCB with a cavity and interior node and vias according to principles of the present invention.

FIG. 5 illustrates yet another embodiment of the present invention. Similar to PCB 200, 300, and 400, PCB 500 may include multiple layers, including surface layer 512, guard layers 516, and interior layer 518 as well as other layers 508. Interior layer 518 may include node 506. Node 506 may be a sensitive node. Additionally, interior layer 518 may include guards for node 506. Further, vias 504a-b may electrically couple guard layers 516 to interior layer 518 and may each be vertically adjacent to interior layer 518. Each layer may be coupled to the other layers via a filler material such as epoxy 510.

Vias 504a-b may be buried-vias and may be configured in a plurality of rows. The plurality of rows may be configured to establish a plurality of current pathways away from the measurement node. The plurality of current pathways may reduce leakage current at node 506 responsive to a signal applied to node 506. Further, each row of vias of the plurality of rows vias may be offset with respect to adjacent rows of vias in a horizontal plane of the PCB 500.

PCB 500 may further include a cavity 514. The cavity 514 may allow access to interior layer 518, and more particularly, to node 506. In such embodiments, vias 504a-b may not be apparent, or visible, from the surface. Additionally, the cavity may be lined, or coated, with a guarding material to further isolate node 506. In certain embodiments, the cavity 514 may include a via, such as a micro-via to further insulate the sensitive node. In other words, a via may be used to allow access to an interior layer of the PCB 500. Thus, the via may extend from an exterior surface layer to the interior layer and allow node 506 to be accessible from the exterior.

Figure 6:
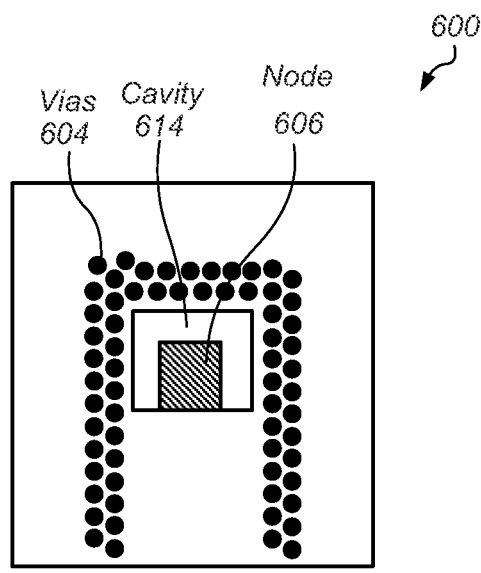
FIG. 6 illustrates a top view of a PCB with a cavity and interior node and vias according to principles of the present invention.

FIG. 6 illustrates yet another embodiment of the present invention. PCB 600 may be similar to or the same as the PCBs previously described, e.g., PCBs 200, 300, 400, or 500. Thus, PCB 600 may include multiple layers, including guard layers that are each vertically adjacent to an interior layer that may include node 606. As shown, a cavity 614 may extend from an exterior layer of PCB 600 to an interior layer of PCB 600 that may include node 606. Note, node 606 may be a sensitive node. Further, vias 604 may be arranged in a plurality of rows that may fence in cavity 614, and more particularly, node 606. The via fence may be configured to establish a plurality of current pathways away from the node. The plurality of current pathways may reduce leakage current at the node responsive to a signal applied to the node. As shown, each row of vias of the plurality of rows of vias may be offset with respect to adjacent rows of vias in a horizontal plane of the PCB. The vias 604 may be micro-vias extending from the exterior surface of PCB 600 through the partially exposed interior layer to a guard plane vertically adjacent to the partially exposed interior layer.

Figure 7:
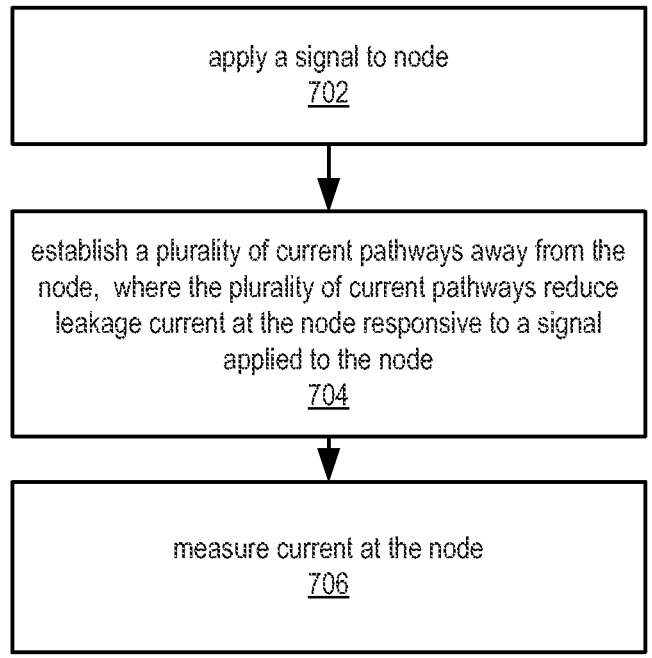
FIG. 7 is a flowchart diagram illustrating one embodiment of a method for measuring current at a measurement node.

FIG. 7—Flowchart of a Method for Measuring Current at a Node

FIG. 7 illustrates a method for measuring current at a node. The method shown in FIG. 7 may be used in conjunction with any of the systems and components shown in the above Figures, among other devices. In various embodiments, some of the method elements shown may be performed concurrently, in a different order than shown, or may be omitted. Additional method elements may also be performed as desired. As shown, this method may operate as follows.

First, in 702 a signal may be applied at a node. The node may be a sensitive node as described above. Further, in certain embodiments, the node may be included on an exterior surface layer of a PCB. In other embodiments, the node may be included on an interior layer of a PCB. In one embodiment, the node may be included on an interior layer of a PCB and accessible via a cavity. In an exemplary embodiment, the cavity may be a via. In particular, the via may be a mirco-via.

In 704, a plurality of current pathways away from the node may be established. The current pathways may reduce leakage current at the node responsive to a signal applied to the node. Note that the leakage current may be due to the dielectric absorption properties of the PCB layer material. In one embodiment, the plurality of rows of vias may be offset with respect to adjacent rows of vias in a horizontal plane of the PCB.

In 706, the current at the node may be measured.

Figure 8:
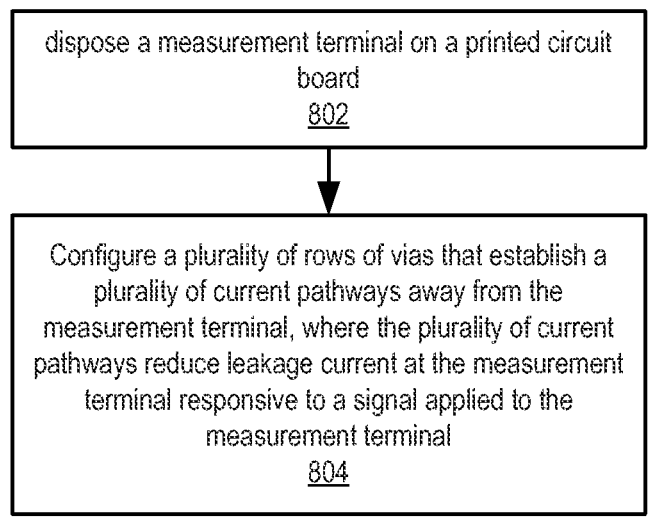
FIG. 8 is a flowchart diagram illustrating one embodiment of a method for fabricating a printed circuit board.

FIG. 8—Flowchart of a Method for Fabricating a PCB

FIG. 8 illustrates a method for fabricating a printed circuit board (PCB). The method shown in FIG. 8 may be used to fabricate a PCB that may be used in conjunction with any of the systems and components shown in the above Figures, among other devices. In various embodiments, some of the method elements shown may be performed concurrently, in a different order than shown, or may be omitted. Additional method elements may also be performed as desired. As shown, this method may operate as follows.

First, in 802 a measurement terminal may be disposed on a PCB. The measurement terminal may be a node and the node may be a sensitive node as described above. Further, in certain embodiments, the measurement terminal may be included on an exterior surface layer of a PCB. In other embodiments, the measurement terminal may be included on an interior layer of a PCB. In one embodiment, the measurement terminal may be included on an interior layer of a PCB and accessible via a cavity. In an exemplary embodiment, the cavity may be a via. In particular, the via may be a mirco-via.

In 804, a plurality of rows of vias may be configured. The plurality of rows of vias may establish current pathways away from the measurement terminal. The current pathways may reduce leakage current at the measurement terminal responsive to a signal applied to the node. Note that the leakage current may be due to the dielectric absorption properties of the PCB layer material.

In one embodiment, the method may also include each row of vias of the plurality of rows of vias being offset with respect to adjacent rows of vias in a horizontal plane of the PCB.

In another embodiment, the PCB may include a plurality of layers. In such embodiments, the measurement terminal may be disposed on a first layer of the plurality of layers and the plurality of rows of vias may be configured in the first layer. Further, the first layer may be an exterior surface layer or an interior layer of the PCB. Accordingly, the vias may be micro-vias, through-vias, or buried vias.

In an exemplary embodiment, where the first layer may be an interior layer, the method may also include a cavity that may be configured in the PCB that may allow access to the measurement terminal. In such embodiments, the cavity may be a via.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A printed circuit board (PCB), comprising:
   first and second measurement nodes, wherein the first and second measurement nodes are configured to measure current responsive to an applied signal; and
   a plurality of rows of vias configured to establish a plurality of current pathways away from the first measurement node, wherein the plurality of current pathways reduce leakage current resulting from dielectric absorption at the first measurement node responsive to the applied signal.

2. The PCB of claim 1, wherein each row of vias of the plurality of rows of vias is offset with respect to adjacent rows of vias in a horizontal plane of the PCB.

3. The PCB of claim 1, wherein the PCB comprises a plurality of layers, wherein the first measurement node and the plurality of rows of vias are comprised in a first layer of the plurality of layers.

4. The PCB of claim 3, wherein the first layer is an exterior surface layer of the PCB.

5. The PCB of claim 4, wherein the plurality of rows of vias comprise at least one of:
   a plurality of rows of micro-vias; and
   a plurality of rows of through-vias.

6. The PCB of claim 4, wherein a second layer of the plurality of layers comprises a guard plane, wherein the guard plane is configured to prevent stray currents from entering the first measurement node, and wherein the second layer is vertically adjacent to the first layer.

7. The PCB claim 3, wherein the first layer is an interior layer of the PCB.

8. The PCB of claim 7, wherein the plurality of rows of vias comprise at least one of:
   a plurality of rows of buried-vias; and
   a plurality of rows of through-vias.

9. The layer of claim 7, wherein a second layer of the plurality of layers and a third layer of the plurality of layers each comprise a guard plane, wherein each guard plane is configured to prevent stray currents from entering the first measurement node, and wherein the second layer and the third layer are each vertically adjacent to the first layer.

10. The PCB of claim 7, wherein the PCB further comprises:
   a cavity, wherein the first measurement node is accessible via the cavity.

11. The PCB of claim 10, wherein the cavity comprises a via.

12. The PCB of claim 10, wherein a second layer of the plurality of layers and a third layer of the plurality of layers each comprise a guard plane, wherein each guard plane is configured to prevent stray currents from entering the first measurement node, and wherein the second layer and the third layer are each vertically adjacent to the first layer.

13. A method for measuring current at a node, comprising:
   applying a signal across first and second measurement nodes, wherein the first and second measurement nodes are configured to measure current responsive to said applied signal; and
   establishing a plurality of current pathways away from the node, wherein the plurality of current pathways reduce leakage current resulting from dielectric absorption at the first measurement node responsive to said applying the signal; and
   measuring the current at the first measurement node.

14. The PCB of claim 1,
wherein the first measurement node is a sensitive node; and
wherein the second measurement node is an aggressor node.

15. The PCB of claim 1,
wherein the value of the measured current is in a range of pico-amperes and lower.

16. The PCB of claim 1,
wherein the value of the measured current is in a range of femto-amperes and lower.

* * * * *